United States Patent
Li et al.

(10) Patent No.: US 11,094,884 B2
(45) Date of Patent: Aug. 17, 2021

(54) RAPID METAL OXIDE LAYER-SPECIFIC PHOTONIC TREATMENT USING UV LED FOR FABRICATION OF FLEXIBLE PEROVSKITE STRUCTURES

(71) Applicant: THE BOARD OF TRUSTEES OF THE UNIVERSITY OF ALABAMA, Tuscaloosa, AL (US)

(72) Inventors: Dawen Li, Tuscaloosa, AL (US); Zhongliang Ouyang, Tuscaloosa, AL (US)

(73) Assignee: THE BOARD OF TRUSTEES OF THE UNIVERSITY OF ALABAMA, Tuscaloosa, AL (US)

( * ) Notice: Subject to any disclaimer, the term of this patent is extended or adjusted under 35 U.S.C. 154(b) by 0 days.

(21) Appl. No.: 16/247,055

(22) Filed: Jan. 14, 2019

(65) Prior Publication Data
US 2019/0221742 A1    Jul. 18, 2019

Related U.S. Application Data

(60) Provisional application No. 62/616,886, filed on Jan. 12, 2018.

(51) Int. Cl.
*H01L 51/00* (2006.01)
*H01L 51/50* (2006.01)
(Continued)

(52) U.S. Cl.
CPC ...... *H01L 51/0026* (2013.01); *H01L 51/0013* (2013.01); *H01L 51/0077* (2013.01);
(Continued)

(58) Field of Classification Search
CPC ............. H01L 51/0026; H01L 51/5056; H01L 51/5072; H01L 51/0013; H01L 51/5206;
(Continued)

(56) References Cited

U.S. PATENT DOCUMENTS

| | | | | |
|---|---|---|---|---|
| 2015/0013747 | A1* | 1/2015 | Holliman | H01G 9/2031 136/244 |
| 2015/0136232 | A1* | 5/2015 | Snaith | H01L 51/0077 136/263 |

(Continued)

OTHER PUBLICATIONS

Palneedi et al., "Laser Irradiation of Metal Oxide Films and Nanostructures: Applications and Advances," Adv. Mater. 2018, 30, 1705148.*

(Continued)

*Primary Examiner* — Julia Slutsker
(74) *Attorney, Agent, or Firm* — Meunier Carlin & Curfman LLC

(57) ABSTRACT

Methods of forming a perovskite-containing film comprising depositing one or more metal oxide layers onto a substrate; and irradiating each metal oxide layer with a UV LED light source after deposition to sinter and/or anneal a target metal oxide in the one or more metal oxide layers without damaging the underlying substrate or perovskite material. The LED light source can be selected to emit a narrow spectral width of pulsed radiation. The radiation emitted can consist essentially of wavelengths within 20 nm of the wavelength of maximum absorbance ($\lambda_{max}$) of the target metal oxide, that is, wavelength from UV LED can be $\lambda_{max} \pm 20$ nm, to achieve layer-specific annealing and sintering of metal oxide charge transport layer. The target metal oxide can include tin oxide in the electron transport layer or nickel oxide in the hole transport layer. Perovskite-containing films formed from the methods described herein are also disclosed.

17 Claims, 3 Drawing Sheets

(51) Int. Cl.
H01L 51/52 (2006.01)
H01L 51/44 (2006.01)
H01L 51/56 (2006.01)
H01L 51/42 (2006.01)

(52) U.S. Cl.
CPC .......... H01L 51/422 (2013.01); H01L 51/442 (2013.01); H01L 51/5056 (2013.01); H01L 51/5072 (2013.01); H01L 51/5206 (2013.01); H01L 51/5221 (2013.01); H01L 51/56 (2013.01); *H01L 51/5012* (2013.01); *H01L 2251/301* (2013.01); *H01L 2251/305* (2013.01); *H01L 2251/308* (2013.01); *H01L 2251/558* (2013.01)

(58) Field of Classification Search
CPC ............... H01L 51/5221; H01L 51/442; H01L 2251/305
See application file for complete search history.

(56) References Cited

U.S. PATENT DOCUMENTS

| | | | | |
|---|---|---|---|---|
| 2018/0182977 | A1* | 6/2018 | Hirose | H01L 51/0077 |
| 2018/0211792 | A1* | 7/2018 | Mori | H01G 9/2031 |
| 2018/0222766 | A1* | 8/2018 | Roqan | C23C 14/28 |

OTHER PUBLICATIONS

Ahn, Namyoung, et al. "Highly reproducible perovskite solar cells with average efficiency of 18.3% and best efficiency of 19.7% fabricated via Lewis base adduct of lead (II) iodide." Journal of the American Chemical Society 137.27 (2015): 8696-8699.

An, Qiaoshi, et al. "Improved efficiency of bulk heterojunction polymer solar cells by doping low-bandgap small molecules." ACS applied materials & interfaces 6.9 (2014): 6537-6544.

Arora, Neha, et al. "Perovskite solar cells with CuSCN hole extraction layers yield stabilized efficiencies greater than 20%." Science 358.6364 (2017): 768-771.

Asghar, M. I., et al. "Device stability of perovskite solar cells—A review." Renewable and Sustainable Energy Reviews 77 (2017): 131-146.

Bi, Cheng, et al. "Non-wetting surface-driven high-aspect-ratio crystalline grain growth for efficient hybrid perovskite solar cells." Nature communications 6 (2015): 7747.

Bi, Dongqin, et al. "Polymer-templated nucleation and crystal growth of perovskite films for solar cells with efficiency greater than 21%." Nature Energy 1.10 (2016): 16142.

Burschka, Julian, et al. "Sequential deposition as a route to high-performance perovskite-sensitized solar cells." Nature 499.7458 (2013): 316.

Chen, Han, et al. "A solvent-and vacuum-free route to large-area perovskite films for efficient solar modules." Nature 550.7674 (2017): 92.

Chiang, Chien-Hung, and Chun-Guey Wu. "Bulk heterojunction perovskite-PCBM solar cells with high fill factor." Nature Photonics 10.3 (2016): 196.

Correa-Baena, Juan-Pablo, et al. "Promises and challenges of perovskite solar cells." Science 358.6364 (2017): 739-744.

DeQuilettes, Dane W., et al. "Photo-induced halide redistribution in organic-inorganic perovskite films." Nature communications 7 (2016): 11683.

Domanski, Konrad, et al. "Systematic investigation of the impact of operation conditions on the degradation behaviour of perovskite solar cells." Nature Energy 3.1 (2018): 61.

Im, Jeong-Hyeok, et al. "Growth of $CH_3NH_3PbI_3$ cuboids with controlled size for high-efficiency perovskite solar cells." Nature nanotechnology 9.11 (2014): 927.

Jeon, Nam Joong, et al. "Solvent engineering for high-performance inorganic-organic hybrid perovskite solar cells." Nature materials 13.9 (2014): 897.

Kojima, Akihiro, et al. "Organometal halide perovskites as visible-light sensitizers for photovoltaic cells." Journal of the American Chemical Society 131.17 (2009): 6050-6051.

Koushik, Dibyashree, et al. "High-efficiency humidity-stable planar perovskite solar cells based on atomic layer architecture." Energy & Environmental Science 10.1 (2017): 91-100.

Lavery, Brandon W., et al. "Intense pulsed light sintering of $CH_3NH_3PbI_3$ solar cells." ACS applied materials & interfaces 8.13 (2016): 8419-8426.

Leguy, Aurélien MA, et al. "Reversible hydration of $CH_3NH_3PbI_3$ in films, single crystals, and solar cells." Chemistry of Materials 27.9 (2015): 3397-3407.

Li, Faming, and Mingzhen Liu. "Recent efficient strategies for improving the moisture stability of perovskite solar cells." Journal of Materials Chemistry A 5.30 (2017): 15447-15459.

Li, Yaowen, et al. "High-efficiency robust perovskite solar cells on ultrathin flexible substrates." Nature communications 7 (2016): 10214.

Liu, Dianyi, and Timothy L. Kelly. "Perovskite solar cells with a planar heterojunction structure prepared using room-temperature solution processing techniques." Nature photonics 8.2 (2014): 133.

Löper, Philipp, et al. "Complex refractive index spectra of $CH_3NH_3PbI_3$ perovskite thin films determined by spectroscopic ellipsometry and spectrophotometry." The journal of physical chemistry letters 6.1 (2014): 66-71.

Luo, Deying, et al. "Enhanced photovoltage for inverted planar heterojunction perovskite solar cells." Science 360.6396 (2018): 1442-1446.

Mesquita, Isabel, Luísa Andrade, and Adélio Mendes. "Perovskite solar cells: Materials, configurations and stability." Renewable and Sustainable Energy Reviews 82 (2018): 2471-2489.

Nie, Wanyi, et al. "High-efficiency solution-processed perovskite solar cells with millimeter-scale grains." Science 347.6221 (2015): 522-525.

Nie, Wanyi, et al. "Light-activated photocurrent degradation and self-healing in perovskite solar cells." Nature communications 7 (2016): 11574.

Petrus, Michiel L., et al. "Capturing the sun: A review of the challenges and perspectives of perovskite solar cells." Advanced Energy Materials 7.16 (2017): 1700264.

Pool, Vanessa L., et al. "Thermal engineering of $FAPbI_3$ perovskite material via radiative thermal annealing and in situ XRD." Nature communications 8 (2017): 14075.

Rong, Yaoguang, et al. "Challenges for commercializing perovskite solar cells." Science 361.6408 (2018): eaat8235.

Tai, Qidong, et al. "Efficient and stable perovskite solar cells prepared in ambient air irrespective of the humidity." Nature communications 7 (2016): 11105.

Tan, Hairen, et al. "Efficient and stable solution-processed planar perovskite solar cells via contact passivation." Science 355.6326 (2017): 722-726.

Troughton, Joel, et al. "Photonic flash-annealing of lead halide perovskite solar cells in 1 ms." Journal of Materials Chemistry A 4.9 (2016): 3471-3476.

Troughton, Joel, et al. "Rapid processing of perovskite solar cells in under 2.5 seconds." Journal of Materials Chemistry A 3.17 (2015): 9123-9127.

Tsai, Hsinhan, et al. "Light-induced lattice expansion leads to high-efficiency perovskite solar cells." Science 360.6384 (2018): 67-70.

Turren-Cruz, Silver-Hamill, et al. "Enhanced charge carrier mobility and lifetime suppress hysteresis and improve efficiency in planar perovskite solar cells." Energy & Environmental Science 11.1 (2018): 78-86.

Wu, Yongzhen, et al. "Perovskite solar cells with 18.21% efficiency and area over 1 cm 2 fabricated by heterojunction engineering." Nature Energy 1.11 (2016): 16148.

Yang, Mengjin, et al. "Perovskite ink with wide processing window for scalable high-efficiency solar cells." Nature Energy 2.5 (2017): 17038.

(56) References Cited

OTHER PUBLICATIONS

Yang, Woon Seok, et al. "Iodide management in formamidinium-lead-halide-based perovskite layers for efficient solar cells." Science 356.6345 (2017): 1376-1379.

Yang, Yang, and Jingbi You. "Make perovskite solar cells stable." Nature News 544.7649 (2017): 155.

You, Jingbi, et al. "Improved air stability of perovskite solar cells via solution-processed metal oxide transport layers." Nature nanotechnology 11.1 (2016): 75.

You, Jingbi, et al. "Low-temperature solution-processed perovskite solar cells with high efficiency and flexibility." ACS nano 8.2 (2014): 1674-1680.

Zhang, Wei, et al. "Ultrasmooth organic-inorganic perovskite thin-film formation and crystallization for efficient planar heterojunction solar cells." Nature communications 6 (2015): 6142.

\* cited by examiner

RAPID METAL OXIDE LAYER-SPECIFIC PHOTONIC TREATMENT USING UV LED FOR FABRICATION OF FLEXIBLE PEROVSKITE STRUCTURES

CROSS-REFERENCE TO RELATED APPLICATIONS

This application claims the benefit of and priority to U.S. Provisional Application No. 62/616,886 filed on Jan. 12, 2018, the disclosure of which is expressly incorporated herein by reference in its entirety.

ACKNOWLEDGEMENT OF GOVERNMENT SUPPORT

This invention was made with government support under Grant No. NSF ECCS-1151140 awarded by the National Science Foundation. The government has certain rights in the invention.

FIELD

The present disclosure relates generally to perovskite based sandwich structures, particularly to rapid photonic treatment of metal oxide charge transport layer using UV LEDs to facilitate fabrication of the perovskite based sandwich structures.

BACKGROUND

Over the past forty years or so there has been an increasing realization of the need to replace fossil fuels with more secure sustainable energy sources. The new energy supply must also have low environmental impact, be highly efficient and be easy to use and cost effective to produce. To this end, solar energy is seen as one of the most promising technologies. However, the high cost of manufacturing devices that capture solar energy, including high material costs, has historically hindered its widespread use.

One class of photovoltaic materials that has attracted significant interest has been the hybrid organic-inorganic halide perovskites. This technology has seen vast improvement in the power conversion efficiencies in a very short period of time. In particular, since the first report of perovskite solar cells in 2012, the technology has evolved to over 20% certified power-conversion efficiency. The cells are based on organo-metal halide perovskite materials characterized by high extinction coefficients and carrier mobilities. The perovskite structure is generally represented by the formula $ABX_3$ and in the case of the organometal halide the A site refers to an organic group, B represents a metal such as lead (Pb), and X is a halide group such as iodine (I), chlorine (Cl), or bromine (Br).

Perovskite solar cells provide ease of manufacturing, use of common materials, and suitable efficiencies. More specifically, these solar cells combine the crystallinity and high charge-transfer found in inorganic semiconductors with the cost-effective low-temperature solvent-based manufacturing of organic solar cells. Additionally, unlike traditional semiconductor solar cells, the perovskite solar cell is amenable to changes in the atoms of its crystal structure. This opens up many possibilities in tuning band gaps, using different cell configurations, and experimenting in processing techniques. However, perovskite materials are generally not stable. For example, methylammonium lead iodide ($CH_3NH_3PbI_3$) perovskite materials allow annealing at temperatures <150° C. Above this temperature, the $CH_3NH_3PbI_3$ decomposes into lead iodide ($PbI_2$) and methylammonium iodide (MAI).

Further, it has been demonstrated that using metal oxides rather than organic materials as charge transport layers is able to enhance device stability. However, the required annealing and sintering temperatures of metal oxide typically are much higher than 150° C. For example, the required annealing and sintering temperatures of $SnO_2$ and NiOx metal oxide are 180° C. and 500° C., respectively. Usually, the fabrication of perovskite solar cells at lab scale employs hot plate for annealing. Because of the limited temperature tolerance of flexible substrates and the perovskite active layer, the annealing temperatures of the metal oxide charge transport layers are usually lower than ~140° C. when using a hot plate. Such low annealing temperatures cause poor crystallinity of metal oxide, thereby deteriorating the charge transport. Also, such heating methods result in temperature reconciliation of all stacking layers due to thermal conduction.

Improved methods for annealing and sintering of metal oxide layers in perovskite-containing thin film structures are desired. The subject matter disclosed herein addresses these and other desires.

SUMMARY

In accordance with the purposes of the disclosed materials, devices, and methods, as embodied and broadly described herein, the disclosed subject matter relates to methods of forming highly stable metal oxide layers in perovskite-containing devices. The methods can include a) depositing one or more metal oxide layers onto a substrate; and b) irradiating each metal oxide layer with a LED light source after deposition. The one or more metal oxide layers can be selected from an electron transport layer, a hole transport layer, or a combination thereof. In certain embodiments, the perovskite-containing films can include two or more metal oxide layers. The metal oxide in the metal oxide layer can be selected from tin oxide, nickel oxide, or a combination thereof. The $\lambda_{max}$ of the metal oxide can be from about 200 nm to about 380 nm, preferably from about 200 nm to about 300 nm or from about 250 nm to about 300 nm. The one or more metal oxide layers can be in direct contact with the perovskite in the perovskite-containing film. In some instances, the perovskite can comprise an organometallic halide having the formula $ABX_3$, wherein A refers to an organic group, B represents a metal, and X is a halide.

The LED light source can be configured to emit pulsed radiation consisting essentially of wavelengths within 50 nm, preferably within 20 nm of the wavelength of maximum absorbance ($\lambda_{max}$) of the target metal oxide in the one or more metal oxide layers, that is, wavelength from UV LED can be $\lambda_{max} \pm 50$ nm or $\lambda_{max} \pm 20$ nm. For example, the light source can emit radiation consisting essentially of wavelengths within 15 nm or within 10 nm of $\lambda_{max}$ of the target metal oxide in the one or more metal oxide layers. The spectral width of the radiation emitted can be 10 nm or less, such as 5 nm or less. In some embodiments, the pulsed radiation is in an effective amount to sinter and/or anneal the one or more metal oxide layers. In certain embodiments, the methods include applying a plurality of pulses to sinter and/or anneal the one or more metal oxide layers. Each pulse can be less than about 1 second such as from about 1 microsecond to less than about 1 second, about 1 millisecond to less than about 1 second, or about 10 milliseconds to less than about 1 second. The light source can be a UV light emitting diode.

The substrate in the perovskite-containing film can be a flexible transparent substrate having a transparent conductive oxide (TCO) coating formed thereon. Suitable examples of substrates that can be used include substrates derived from fluorine-doped tin oxide (FTO) or indium tin oxide (ITO).

In specific examples, the methods of making the perovskite-containing films can include: depositing a hole transport layer on the substrate; annealing and/or sintering the hole transport layer by irradiation with a UV LED light source without damaging the underlying substrate; depositing a perovskite layer on the hole transport material; depositing an electron transport layer on the perovskite layer; annealing and/or sintering the electron transport layer by irradiation with a UV LED light source without damaging the underlying perovskite layer; and depositing an electrode layer on the electron transport layer. In further examples, the methods of making the perovskite-containing films can include: depositing an electron transport layer on the substrate; annealing and/or sintering the electron transport layer by irradiation with a UV LED light source without damaging the underlying substrate; depositing a perovskite layer on the electron transport material; depositing a hole transport layer on the perovskite layer; annealing and/or sintering the hole transport layer by irradiation with a UV LED light source without damaging the underlying perovskite layer; and depositing an electrode layer on the hole transport layer. The light source can be configured to emit pulsed radiation consisting essentially of wavelengths within 20 nm of the wavelength of maximum absorbance ($\lambda_{max}$) of a metal oxide present in the hole transport layer or the electron transport layer, that is, wavelength from UV LED can be $\lambda_{max}\pm20$ nm.

The perovskite-containing films disclosed herein can be prepared by a roll-to-roll printing process.

Perovskite-containing films formed from a method described herein are also disclosed. Specifically, the perovskite-containing films can include a transparent conductive substrate comprising indium tin oxide; a hole transport layer comprising nickel oxide deposited on a surface of the transparent conductive substrate; a perovskite layer deposited on a surface of the hole transport layer opposite the transparent conductive substrate; an electron transport layer comprising tin oxide deposited on a surface of the perovskite layer opposite the hole transport layer; and a top layer comprising a metal deposited on a surface of the electron transport layer. Alternately, the perovskite-containing films can include a transparent conductive substrate comprising fluorine doped tin oxide; an electron transport layer comprising tin oxide deposited on a surface of the transparent conductive substrate; a perovskite layer deposited on a surface of the electron transport layer opposite the transparent conductive substrate; a hole transport layer comprising nickel oxide deposited on a surface of the perovskite layer opposite the electron transport layer; and a top layer comprising a metal deposited on a surface of the hole transport layer. In some cases, the perovskite layer can have a thickness of from about 300 nm to about 500 nm. In certain aspects, the disclosed perovskite-containing film can be present in a solar cell, a photodetector, or a LED.

Additional advantages will be set forth in part in the description that follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

BRIEF DESCRIPTION OF THE DRAWINGS

The accompanying drawing, which is incorporated in and constitute a part of this specification, illustrates an embodiment of the disclosure and together with the description, serve to explain the principles of the disclosure.

DETAILED DESCRIPTION

General Definitions

Figures 1A, 1B, 1C:
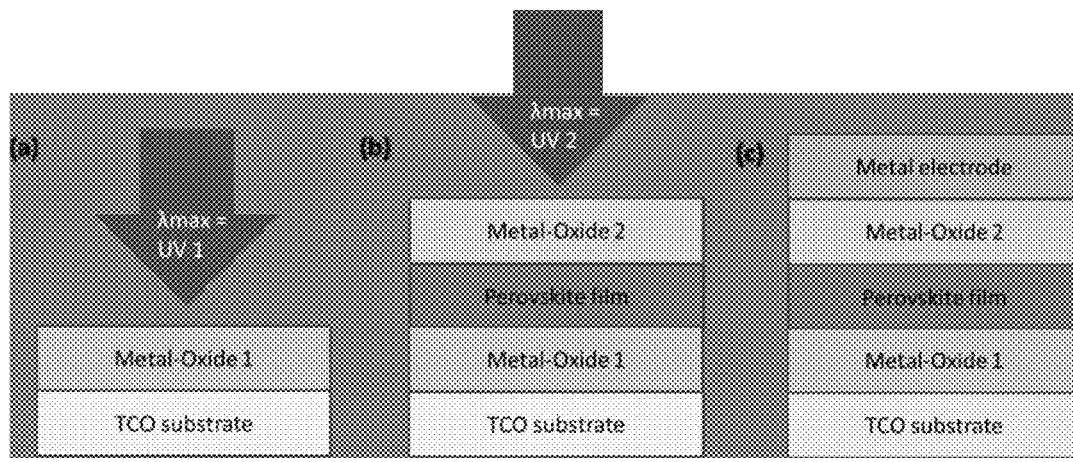
FIGS. 1A-1B-1C show schematic of annealing and sintering of metal oxide 1 on TCO substrate from UV LEDs which emit wavelength of maximum absorption ($\lambda_{max}$) of the metal oxide 1 (FIG. 1A), and annealing and sintering of metal oxide 2 on top of perovskite film from UV LEDs which emit wavelength of maximum absorption ($\lambda_{max}$) of the metal oxide 2 (FIG. 1B), and resulted typical structure of perovskite solar cells (FIG. 1C)
Figures 2A, 2B:
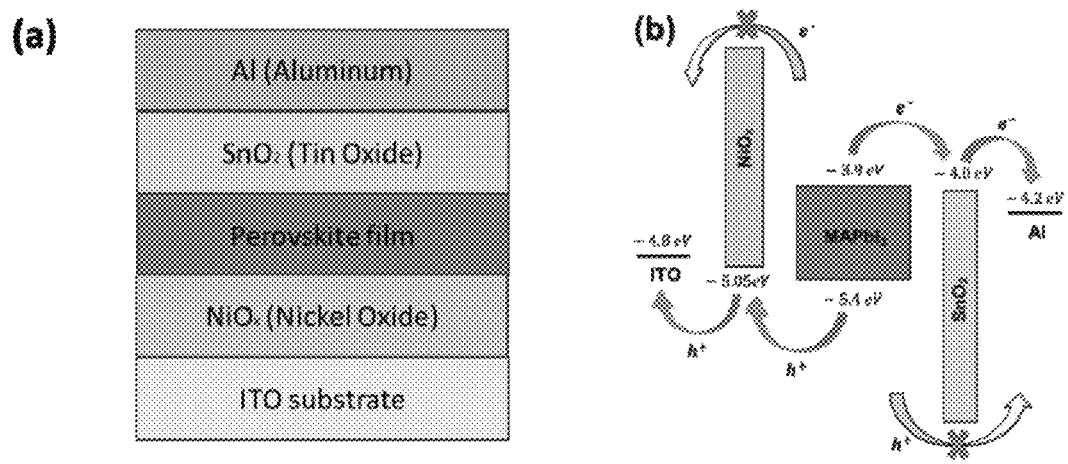
FIGS. 2A-2B show schematic of an exemplary perovskite solar cell (FIG. 2A), and its corresponding band energy (FIG. 2B).
Figures 3A, 3B:
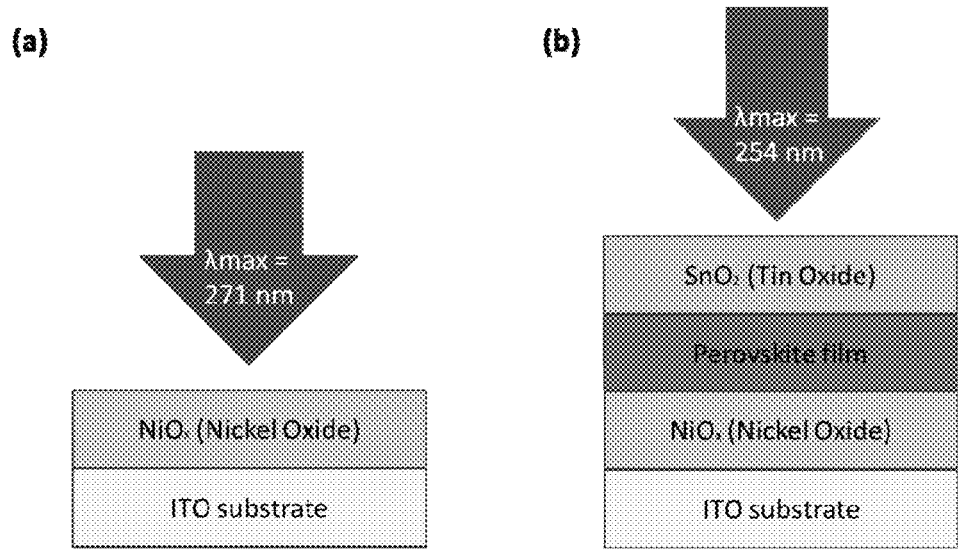
FIGS. 3A-3B show schematic of an exemplary annealing and sintering of nickel oxide on ITO substrate from UV LEDs emitting light with wavelength about 271 nm which is the maximum absorption ($\lambda_{max}$) of the nickel oxide (FIG. 3A), and annealing and sintering of tin oxide on top of perovskite film from UV LEDs emitting light with wavelength about 254 nm which is the maximum absorption ($\lambda_{max}$) of the tin oxide (FIG. 3B).
Figures 4A, 4B:
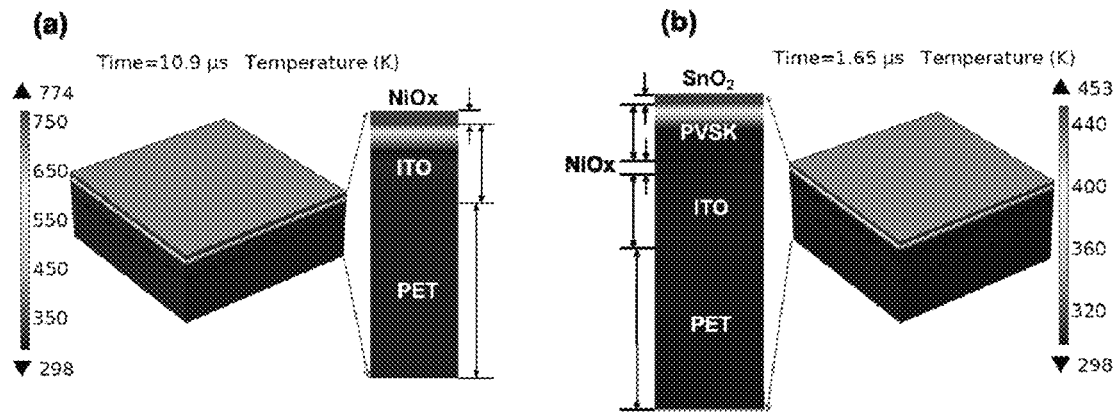
FIGS. 4A-4B show a vertical temperature distribution for an exemplary NiOx/ITO/PET (FIG. 4A) and $SnO_2$/PVSK/NiOx/ITO/PET (FIG. 4B) under pulsed LED illumination, demonstrating rapid and layer-specific annealing of metal oxide without damaging underlying perovskite and flexible substrate.
Figures 5A, 5B:
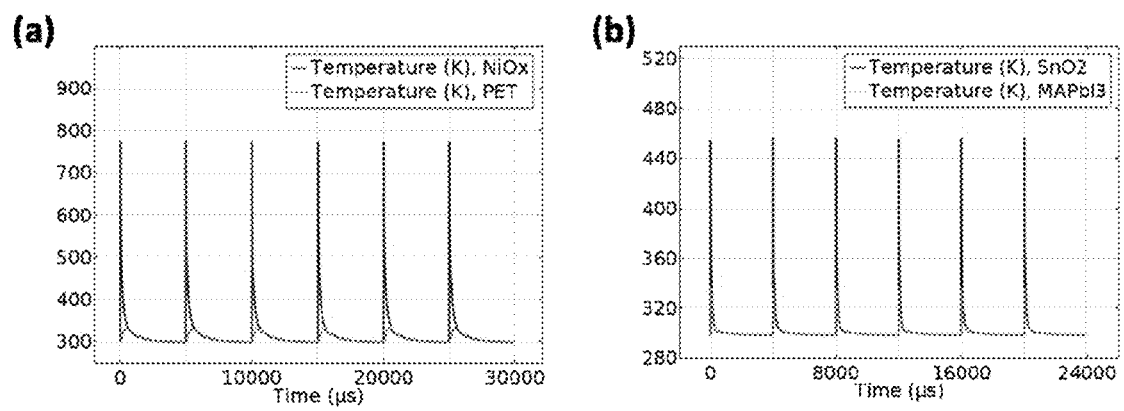
FIGS. 5A-5B show exemplary photonic treatments of NiOx (FIG. 5A) and $SnO_2$ (FIG. 5B) layers with multiple pulses without overheating the underlying films.

Before the present devices and methods are disclosed and described, it is to be understood that throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a wavelength" includes mixtures of two or more such wavelengths, reference to "the film" includes mixtures of two or more such films, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that when a value is disclosed, then "less than or equal to" the value, "greater than or equal to the value," and possible ranges between values are also disclosed, as appropriately understood by the skilled artisan. For example, if the value "10" is disclosed, then "less than or equal to 10" as well as "greater than or equal to 10" is also disclosed. It is also understood that throughout the application data are provided in a number of different formats and that this data represent endpoints and starting points and ranges for any combination of the data points. For example, if a particular data point "10" and a particular data point "15" are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Devices

The present disclosure relates to perovskite-containing films and devices comprising a perovskite material. Methods for producing the perovskite-containing films whereby one or more metal oxide layers are deposited on a substrate and is subsequently annealed and/or sintered are also provided. The resulting perovskite-containing film may form at least a portion of any electronic device suitable for including a perovskite material, such as, but not limited to, a solar cell, a light emitting diode (LED), a photodetectoror a combination thereof. Specifically disclosed herein are perovskite solar cells that can be manufactured by roll-to-roll printing while still exhibiting high efficiency.

The term "perovskite," as used herein, refers to a material having the general structural formula $ABX_3$, wherein A and B are cations of different sizes and X is an anion. The skilled person will also appreciate a perovskite material could be represented by the formula $[A][B][X]_3$, wherein A is at least one cation, B is at least one cation and X is at least one anion. In some embodiments, the "A" component of the material is selected from methylammonium $CHNH_3$ (MA), formamidinum $CH(NH_2)_2$ (FA), and n-butylammonium and tetra-butylammonium $C_4H_9NH_3$ (BA); the B component is selected from a transition metal such as Pb, Sn; and the X component is selected from a halogen such as I, Cl, Br and variants thereof. Additionally or alternatively, in the case of an organometal halide, the A site refers to an organic group, B represents a metal such as lead, and X is a halide group such as iodide, chloride, or bromide. For example, suitable perovskite materials include, but are not limited to, materials selected from the group consisting of: $MAPbI_3$, $MAPbBr_3$, $MAPbI_xBr_{3-x}$, $MAPbI_xCl_{3-x}$, $FAPbI_3$, $FAPbBr_3$, $FAPbI_xBr_{3-x}$, $FAPbI_xCl_{3-x}$, $BAPbI_3$, $BAPbBr_3$, $BAPbI_xBr_{3-x}$, $BAPbI_xCl_{3-x}$, $MASnI_3$, $MASnBr_3$, $MASnI_xBr_{3-x}$, $FASnI_3$, $FASnBr_3$, $FASnI_xBr_{3-x}$, $FASnI_xCl_{3-x}$, $BASnI_3$, $BASnBr_3$, $BASnI_xBr_{3-x}$, $BASnI_xCl_{3-x}$, and combinations and mixtures thereof. In some embodiments, the choice of Cl as the halide results in a wider than ideal bandgap, but allows for a film deposition in an uncontrolled environment.

The perovskite-containing films can include a perovskite layer derived from a perovskite material as described herein. The perovskite layer can have a thickness of from about 300 nm or greater, such as from about 300 nm to about 600 nm, from about 300 nm to about 500 nm, from about 300 nm to about 450 nm, or from about 350 nm to about 450 nm.

Conventional perovskite-containing films include charge transporting materials in addition to the perovskite layer. The perovskite-containing films can further include a substrate, an electrode layer, or a combination thereof. For example, the perovskite-containing film can be arranged such that the substrate comprising a conductive material is provided as a first layer, a hole transport layer is deposited on a surface of the substrate layer; a perovskite layer is deposited on a surface of the hole transport layer opposite the transparent conductive substrate; an electron transport layer is deposited on a surface of the perovskite layer opposite the hole transport layer; and an electrode layer is deposited on a surface of the electron transport layer. Alternately, the perovskite-containing film can be arranged such that the substrate comprising a conductive material is provided as a first layer, an electron transport layer is deposited on a surface of the substrate layer; a perovskite layer is deposited on a surface of the electron transport layer opposite the transparent conductive substrate; a hole transport layer is deposited on a surface of the perovskite layer opposite the electron transport layer; and an electrode layer is deposited on a surface of the hole transport layer.

The charge transporting materials can include any suitable metal oxide material that facilitates a low resistance, charge selective contact between the conductive material and the perovskite layer, reducing a possible loss in built-in potential across the device. The absorption of the metal oxide can be in the UV range of the electromagnetic spectrum. In some embodiments, the metal oxide has a wavelength of maximum absorbance ($\lambda_{max}$) of 380 nm or less, less than 375 nm, less than 350 nm, less than 325 nm, 300 nm or less, less than 300 nm, 275 nm or less, from 200 nm to 350 nm, from 250 nm to 350 nm, from 200 nm to 325 nm, from 200 nm to 310 nm, from 200 nm to 300 nm or from 250 nm to 300 nm. Conventionally, organic materials may also be used in the charge transport layers, however, metal oxides demonstrate much higher stability than the organic materials. Metal oxides can be obtained by solution processing from their corresponding precursors or nanoparticles at low temperature.

In some embodiments, the perovskite-containing films can include a hole transport layer and an electron transport layer as the charge transporting materials. The hole transport layer and/or the electron transport layer can be in direct contact with the perovskite layer. For example, the perovskite-containing films can include a hole transport layer, a perovskite layer deposited on a surface of the hole transport layer, and an electron transport layer deposited on a surface of the perovskite layer opposite the hole transport layer.

The hole transport layer can comprise an oxide of nickel, molybdenum, copper or vanadium, or a mixture thereof. In some examples, the metal oxide used as the hole transport material include $NiO_x$. The hole transport layer can have a thickness of from about 10 nm to about 100 nm, such as from about 25 nm to about 75 nm, or from about 40 nm to about 60 nm.

As described herein, the perovskite-containing film can also comprise an electron transport layer. The electron transport layer can also be derived from a metal oxide selected from an oxide of titanium, tin, zinc, niobium, tantalum, tungsten, indium, gallium, neodinium, palladium or cadmium, or a mixture thereof. For instance, the electron transport layer can comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. In some examples, the metal oxide used as the electron transport material is $SnO_2$. The electron transport layer can have a thickness of from about 10 nm to about 100 nm, such as from about 25 nm to about 75 nm, or from about 40 nm to about 60 nm.

The substrate layer can include any suitable material for withstanding the processing conditions and supporting the layers applied thereto. Withstanding the processing conditions, as used herein, refers to maintaining or substantially maintaining structural and/or chemical properties following exposure to processing conditions. In some embodiments, the substrate can be transparent and/or electrically conductive. For example, one suitable substrate includes a transparent glass substrate with a transparent electrically conductive coating thereon. In some embodiments, the substrate is flexible with a transparent electrically conductive coating, such that the film can be manufactured in roll-to-roll processing. Suitable flexible substrates include, but are not limited to, polymers, such as plastics.

The substrate can include a conductive coating formed thereon. In some embodiments, the conductive coating can be transparent. Examples of suitable conductive coatings include fluorine-doped tin oxide (FTO) or indium tin oxide (ITO).

The electrode layer can be derived from any suitable material, such as a metal. Suitable examples can include an aluminum electrode, a silver (Ag) electrode, copper (Cu), a gold electrode, or conductive carbon.

In some embodiments of the films disclosed herein, there is provided a perovskite-containing film which comprises a transparent conductive substrate, a hole transport layer, a perovskite layer, an electron transport layer, and a metal electrode in that order. However, the ordinary skilled person in the art, although described above as an ordered film may include any other suitable order of layers. For example, in some embodiments, the films can include the layers in reverse order, where the electron transport layers can be deposited directly over the substrate, followed by the perovskite layer, an optional mesoporous layer, and then the hole transport layer.

Methods

Methods of making the perovskite films are also disclosed. The methods disclosed herein provide perovskite-containing films with excellent stability, good crystallinity, and improved efficiency compared to conventional perovskite-containing films. In particular, although perovskite solar cells have made rapid progress in efficiency (over 20%), instability and long annealing time still hold back perovskite films from low-cost manufacturing through roll-to-roll printing. Employing metal oxides rather than organic materials as charge transport layers has been demonstrated to significantly enhance device stability. However, with commonly used hot-plate annealing, metal-oxides require high temperature and long time to form desired crystallinity. Further, hot plates heat all the deposited layers simultaneously, which can be destructive to the flexible substrates and perovskite active layer. Also, lengthy and tedious annealing using hot plate is not compatible with high-speed printing.

In the methods disclosed herein, rapid irradiation from pulsed light-emitting diodes (LEDs) is utilized to attain highly selective annealing and sintering. By choosing a suitable wavelength and manipulating pulse width, LED irradiation is capable of accomplishing layer-specific photonic treatment of metal oxide charge transport layers without damaging the underlying flexible substrate and perovskite materials. The disclosed methods not only improve perovskite-containing films stability, but also maintain the efficiency, achieving the best of both worlds in device performance.

Conventionally, once the charge transport layer and/or perovskite layer has been deposited, in some embodiments, the layers then undergoes a heat annealing process by exposure to an elevated temperature to form a more uniform and crystalline film. Unlike prior methods of forming a perovskite-containing film, the presently-described methods do not utilize a thermal annealing process whereby heat is applied over a longer period of time, such as by use of a heating plate. Rather, in the presently disclosed methods, the metal oxide charge transport layer(s) can be post-treated with irradiation from UV LED light source as described herein. The UV LED light source can provide rapid sintering and/or annealing in which fast pulses (<1 second) of narrow wavelength light (e.g., from 200-380 nm or from 250-300 nm) directed towards and absorbed by a target metal oxide in the layer(s). The absorbed energy can crystallize the metal oxide. In some examples, to control the metal oxide crystallization due to the absorbed energy, the radiation process can be carried out using one or a series of short pulses from the LED (that is, an intense pulsed light (IPL) sintering process from LED is utilized).

The time scales of the short pulse(s) can range from milliseconds (ms) to less than 1 second. For instance, a duration of the short pulses includes, but is not limited to, between about 10 ms and less than 1 second per pulse. In another embodiment, each pulse is about a 2 ms pulse. In some examples, the sintering can occur using a single pulse of less than 1 second. In other examples, however, it may be advantageous to utilize multiple pulses (e.g., up to 20 pulses, between 2 and 20 pulses, or between 5 and 20 pulses) in order to obtain high quality metal oxide crystals. The intense pulsed light sintering can be performed at an intense pulsed light energy of about 1000 J/pulse, about 1100 J/pulse, about 1200 J/pulse, about 1300 J/pulse, about 1400 J/pulse, about 1500 J/pulse, about 1600 J/pulse, about 1700 J/pulse, about 1800 J/pulse, about 1900 J/pulse, or about 2000 J/pulse. The pulsed light sintering of the metal oxide layers in the perovskite-containing films can be performed with a LED or LED arrays. An advantage of the methods disclosed herein is the high processing speed, which is much less than spending hours in an oven or on a hot plate.

The UV LED light source can be configured to emit radiation having a narrow spectral width. For example, the light source can emit radiation over a bandwidth of 40 nm or less, such as 30 nm or less, 25 nm or less, 20 nm or less, 10 nm or less, less than 10 nm, 9 nm or less, 8 nm or less, 7 nm or less, 6 nm or less, or 5 nm or less. In some examples, the light source can be configured to emit a single wavelength.

The specific light source used in the methods can emit wavelength that is within 50 nm of the wavelength of maximum absorption ($\lambda_{max}$) of the metal oxide in the perovskite-containing film, that is, wavelength from UV LED can be $\lambda_{max} \pm 50$ nm. For example, the light source can emit pulsed radiation having wavelength within 45 nm, within 40 nm, within 35 nm, within 30 nm, within 25 nm, within 20 nm, within 15 nm, within 10 nm, or within 5 nm of $\lambda_{max}$ of the metal oxide in the perovskite-containing film. In some embodiments, the light source emits pulsed radiation having a wavelength equivalent to $\lambda_{max}$ of the metal oxide in the perovskite-containing film.

The wavelength of light used will depend on the wavelength of maximum absorption ($\lambda_{max}$) if the specific metal oxide present. In some embodiments, the $\lambda_{max}$ of the metal oxide can be 150 nm or greater, 175 nm or greater, 200 nm or greater, 215 nm or greater, 235 nm or greater, 250 nm or greater, 275 nm or greater, or 300 nm or greater. In some embodiments, the $\lambda_{max}$ of the metal oxide can be 400 nm or less, 380 nm or less, 375 nm or less, 350 nm or less, 325 nm or less, or 300 nm or less. In some embodiments, the $\lambda_{max}$ of the metal oxide can be from 150 to less than 400 nm, from 200 nm to 380 nm, from 200 nm to 350 nm, from 200 nm to 300 nm, or from 250 nm to 300 nm.

When a specific layer of the film is irradiated by the LED light source, light is absorbed primarily by the target layer having a wavelength of maximum absorption similar to the wavelength of the light source. In this case, an energy input by the LED light source is absorbed in the desired metal oxide layer than the surrounding/underlying layer, for example, the perovskite layer or the flexible substrate.

In specific examples, the methods disclosed herein can include providing a substrate comprising a conductive material. The method can further include depositing a hole transport layer on a surface of the substrate. The coated substrate comprising the hole transport layer can then be irradiated by a LED light source as described herein to sinter and/or anneal the hole transport layer. The method can further include forming a perovskite layer over the hole transport layer. The method can further include depositing an electron transport layer using any suitable process over the perovskite layer. The coated perovskite layer comprising the electron transport layer can then be irradiated by a LED light source as described herein to sinter and/or anneal the electron transport layer.

Alternately, the methods disclosed herein can include providing a substrate comprising a conductive material. The method can further include depositing an electron transport layer on a surface of the substrate. The coated substrate comprising the electron transport layer can then be irradiated by a LED light source as described herein to sinter and/or anneal the electron transport layer. The method can further include forming a perovskite layer over the electron transport layer. The method can further include depositing a hole transport layer using any suitable process over the perovskite layer. The coated perovskite layer comprising the hole transport layer can then be irradiated by a LED light source as described herein to sinter and/or anneal the hole transport layer.

It is believed that the presently-described methods provide improvements in the manufacturability of perovskite-containing films such as perovskite solar cells, or other perovskite containing devices, by achieving rapid and layer-specific annealing and sintering of metal oxide layers and eliminating the common rate-limiting annealing step. Additionally or alternatively, the presently-described methods enable and/or permits production of perovskite solar cells or other perovskite containing devices via a continuous roll-to-roll process that is similar to the printing press used in the newspaper industry. The perovskite containing devices may include but not limited to perovskite solar cells, perovskite photodetectors, and perovskite light-emitting diodes (LEDs). Since the presently-described methods provide capability for rapid highly-selective annealing and sintering of metal oxide layers without damaging the underlying layers, the methods can also be applied to organic semiconductor containing devices, including but not limiting to organic solar cells, organic photodetectors and organic light-emitting diodes (LEDs). Similar to perovskite materials, organic semiconductors cannot withstand high annealing temperatures as required from metal oxide charge transport layers. The presently-described methods are also capable of accomplishing rapid annealing and sintering of metal oxide layers from UV LEDs without damaging underlying organic semiconductor and/or flexible substrates. Damage of the underlying flexible substrate can include burning or loss of smooth surface and mechanical strength of the polymer substrate. Damage to the perovskite layer can include decomposition of perovskite materials, resulting in degraded device performance.

By way of non-limiting illustration, examples of certain examples of the present disclosure are given below.

Examples

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1: Rapid Layer-Specific Photonic Treatment for High-Speed Printing of Flexible Perovskite Solar Cells Although perovskite solar cells (PVSC) have made rapid progress in efficiency (over 20%), instability and long annealing time still hold back PVSCs from low-cost manufacturing through roll-to-roll printing. Employing metal oxides rather than organic materials as charge transport layers has been demonstrated to significantly enhance device stability. With commonly used hot-plate annealing, metal-oxides require high temperature and long time to form desired crystallinity. However, hot plates heat all the deposited layers simultaneously, which is destructive to the flexible substrates and perovskite active layer. Also lengthy and tedious annealing using hot plate is not compatible with high-speed printing. In this example, rapid irradiation from pulsed light-emitting diodes (LEDs) will be utilized to attain highly-selective annealing and sintering of metal oxide charge transport layers. By choosing the right wavelength and manipulating pulse width, LED irradiation is capable of accomplishing layer-specific photonic treatment of metal oxide charge transport layers without damaging the underlying flexible substrate and perovskite materials. The high-quality metal oxide films will not only improve PVSC stability, but also maintain the efficiency, achieving the best of both worlds in device performance.

Among photonic treating technologies, high-intensity Xenon flash lamps have been widely used. However, such light source is not suitable for the annealing and sintering of $SnO_2$ and $NiO_x$ metal-oxide layers which are most commonly used metal oxide charge transport layers in perovskite solar cells. The Xenon light has a broad spectrum, in which the ultraviolet (UV) irradiation represents only a small fraction of the whole output power, while the absorption of $SnO_2$ and $NiO_x$ are all in the UV range with peak wavelengths of about 254 nm and about 271 nm, respectively. Beyond the UV range, i.e., in visible and infrared (IR) spectrum, the $NiO_x$ and $SnO_2$ have extremely weak absorption. If Xenon light is used to anneal the $SnO_2$ or $NiO_x$ layer, the majority of the photons, which falls in the categories of visible and infrared range, will propagate to the underlying layers instead of being absorbed by the metal-oxide film. Obviously, Xenon lamp is not capable of serving as a feasible annealing tool to treat the $SnO_2$ and $NiO_x$ charge transport layers. Only light sources with highly-selective band of wavelength could be utilized to accomplish layer-specific treatment for $SnO_2$ and $NiO_x$ without causing damage to the underlying films. LED is such a light source with precisely organized spectrum of less than 10 nm width. And different LEDs with their unique signature peak wavelengths can be found in every range including UV, visible and IR. Given the same amount of output power, LEDs have much more photons that can be absorbed by the target layer. Moreover, as solid-state devices, LEDs are more energy efficient in converting electricity to light and have much longer life time, which makes LED light much cheaper and more reliable in the long run than Xenon lamps.

There exist other strong UV light sources, such as mercury-vapor lamps or metal-halide lamps. However, these lamps require a warm-up time of several minutes. As stated above, in order to attain a layer-specific treatment without thermal conduction, capability of being pulsed with short enough width is the other prerequisite for the light source. Unlike mercury and halide lamps, LEDs can have a response time as low as 20 nanoseconds, providing a wide window and precise control for pulsing.

What is claimed is:

1. A layer-specific method of forming a perovskite-containing structure, comprising:
   a) depositing a metal oxide-based layer comprising a metal oxide onto a substrate or onto a material comprising a layer of perovskite material; and
   b) irradiating the metal oxide-based layer after step a) with a UV light emitting diode (LED) light source to induce a change in crystallinity of the metal oxide, wherein the UV LED light source emits radiation consisting essentially of wavelengths within 20 nm of the wavelength of maximum absorbance ($\lambda_{max}$) of the metal oxide present in the metal oxide-based layer, wherein the $\lambda_{max}$ is from 150 nm to 400 nm,
   wherein the method results in photonic treatment of the metal oxide-based layer without treating the substrate.

2. The method of claim 1, wherein the UV LED light source consists essentially of wavelengths within 10 nm of $\lambda_{max}$ of the metal oxide in the metal oxide-based layer.

3. The method of claim 1, wherein the UV LED light source emits pulsed radiation having a spectral width of 40 nm or less.

4. The method of claim 1, wherein the UV LED light source emits radiation having a spectral width of 40 nm or less, and wherein the radiation is in an effective amount to sinter and/or anneal the metal oxide-based layer.

5. The method of claim 3, wherein each pulse is from about 1 millisecond to less than about 1 second.

6. The method of claim 1, wherein the metal oxide is selected from tin oxide, nickel oxide, or a combination thereof.

7. The method of claim 1, wherein the metal oxide-based layer are in direct contact with the perovskite material.

8. A method of forming a perovskite-containing structure, comprising:
   a) depositing a first charge transport layer comprising a first metal oxide on a substrate;
   b) irradiating the first charge transport layer with a UV LED light source, wherein the UV LED light source emits radiation consisting essentially of wavelengths within 20 nm of the wavelength of maximum absorbance ($\lambda_{max}$) of the first metal oxide present in the first charge transport layer, wherein the $\lambda_{max}$ is from 150 nm to 400 nm;
   c) depositing a perovskite layer comprising a perovskite material on the first charge transport layer;
   d) depositing a second charge transport layer comprising a second metal oxide on the perovskite layer, and
   e) irradiating the second charge transport layer with a UV LED light source, wherein the UV LED light source emits radiation consisting essentially of wavelengths within 20 nm of the wavelength of maximum absorbance ($\lambda_{max}$) of the second metal oxide present in the second charge transport layer, wherein the $\lambda_{max}$ is from 150 nm to 400 nm.

9. The method of claim 8, wherein the UV LED light source consists essentially of wavelengths within 10 nm of the $\lambda_{max}$ of the metal oxide.

10. The method of claim 8, wherein the first charge transport layer is a hole transport layer comprising nickel oxide, and wherein the second charge transport layer is an electron transport layer comprising tin oxide.

11. The method of claim 8, wherein the first charge transport layer is an electron transport layer comprising tin oxide, and the second charge transport layer is a hole transport layer comprising nickel oxide.

12. The method of claim 8, wherein the perovskite-containing structure is prepared by a roll-to-roll printing process.

13. The method of claim 1, further comprising integrating the perovskite-containing structure in a solar cell, a photo-detector, or a light-emitting diode.

14. The method of claim 1, wherein the substrate is a transparent conductive substrate.

15. The method of claim 8, further comprising integrating the perovskite-containing structure in a solar cell, a photo-detector, or a light-emitting diode.

16. The method of claim 8, wherein the substrate is a transparent conductive substrate.

17. The method of claim 8, wherein the perovskite-containing structure is prepared by a solution processing technique.

* * * * *